(12) United States Patent
Einhaus et al.

(10) Patent No.: US 8,216,373 B2
(45) Date of Patent: Jul. 10, 2012

(54) DEVICE AND PROCESS FOR PRODUCING A BLOCK OF CRYSTALLINE MATERIAL

(75) Inventors: Roland Einhaus, Bourgoin Jallieu (FR); Francois Claude Lissalde, Seyssins (FR); Pascal Rivat, Saint Etienne de Saint Geoirs (FR)

(73) Assignees: Apollon Solar, Paris (FR); Cyberstar, Echirolles (FR); EFD Induction SA, Seyssinet Pariset (FR)

( * ) Notice: Subject to any disclaimer, the term of this patent is extended or adjusted under 35 U.S.C. 154(b) by 1043 days.

(21) Appl. No.: 12/087,308

(22) PCT Filed: Dec. 6, 2006

(86) PCT No.: PCT/FR2006/002661
§ 371 (c)(1),
(2), (4) Date: Jul. 1, 2008

(87) PCT Pub. No.: WO2007/077305
PCT Pub. Date: Jul. 12, 2007

(65) Prior Publication Data
US 2010/0083895 A1 Apr. 8, 2010

(30) Foreign Application Priority Data
Jan. 4, 2006 (FR) .................................. 06 00049

(51) Int. Cl.
C30B 35/00 (2006.01)
(52) U.S. Cl. .............. 117/217; 117/11; 117/37; 117/49; 117/50; 117/51; 117/200; 117/205; 117/206; 117/222

(58) Field of Classification Search ............... 117/11, 117/37, 49, 50, 51, 200, 205, 206, 217, 222
See application file for complete search history.

(56) References Cited

U.S. PATENT DOCUMENTS

| 4,687,646 | A | 8/1987 | Mateika et al. |
| 6,027,563 | A | 2/2000 | Choudhury et al. |
| 6,143,070 | A * | 11/2000 | Bliss et al. .................. 117/49 |
| 6,299,682 | B1 | 10/2001 | Wakita et al. |
| 7,442,255 | B2 * | 10/2008 | Einhaus et al. ............... 117/200 |
| 2006/0144326 | A1 | 7/2006 | Einhaus et al. |

FOREIGN PATENT DOCUMENTS

| DE | 25 43 572 A1 | 4/1977 |
| EP | 0 781 865 A2 | 7/1997 |
| JP | A 10-139580 | 5/1998 |
| WO | WO 2004/094704 A2 | 11/2004 |

* cited by examiner

Primary Examiner — Matthew Song
(74) Attorney, Agent, or Firm — Oliff & Berridge, PLC

(57) ABSTRACT

A temperature gradient is established in a crystallization crucible by means of a heat source and a cooling system. The cooling system comprises a heat exchanger and an adjustable additional heat source. The cooling system is preferably formed by an induction coil cooled by a coolant liquid circulating in the induction coil and by an electrically conductive induction susceptor positioned between the crucible and induction coil. The fabrication process comprises heating the crucible via the top and controlling heat extraction from the crucible downwards by means of the heat exchanger and by means of regulation of the adjustable additional heat source.

10 Claims, 2 Drawing Sheets

DEVICE AND PROCESS FOR PRODUCING A BLOCK OF CRYSTALLINE MATERIAL

BACKGROUND OF THE INVENTION

The invention relates to an equipment for the fabrication of a block of crystalline material by directional crystallization comprising heating means and cooling means arranged such as to establish a temperature gradient in a crystallization crucible, the cooling means comprising a heat exchanger and an adjustable additional heat source.

STATE OF THE ART

The document WO2004/094704 describes an equipment for fabrication of a block of crystalline material by directional crystallization. This material is typically silicon. As represented in FIG. 1, the device comprises a crystallization crucible 1 the bottom 7 of which enables heat to be extracted. The bottom 7 of the crucible 1 has greater thermal transfer properties than those of the side walls 8. To generate a temperature gradient, a heating element 3 and a heat exchanger 4 are respectively arranged above and below the crucible 1.

The temperature gradient for the solidification of silicon requires an efficient heat extraction. The anisotropic properties of the crucible 1 enable substantially flat and parallel isothermal planes to be obtained. The solidification front is consequently substantially flat in a direction parallel to the bottom 7 of the crucible 1.

When crystallization of the silicon takes place, the thickness of the solid phase 5 increases so that the solidification front progresses upwards moving away from the bottom 7 of the crucible 1, as represented by the arrow 20 in FIG. 1. The melting temperature of silicon being 1410° C., the 1410° C. isothermal plane then moves away from the bottom 7 of the crucible 1, resulting from the temperature decrease at the bottom 7 of the crucible 1 during the crystallization process.

The increase of the quantity of solidified material at the bottom 7 of the crucible 1 is accompanied by an increase of the thermal resistance. To keep the temperature gradient at the solid/liquid interface constant, the thermal power removed by the heat exchanger 4 needs however have to remain substantially constant throughout the solidification sequence. Therefore an adjustment then has to be provided.

The heat exchanger 4 thus comprises for example a coolant fluid circuit and, depending on the applications, the fluid can be synthetic oil or a fluid operating at high temperature, for example a gas under pressure such as helium, which can be very costly when a helium liquefier is required. It is possible to make the temperature of the coolant fluid vary in a controlled manner to ensure that the power removed remains constant throughout the solidification sequence.

Document WO2004/094704 for example describes a graphite felt 9 arranged between the bottom 7 of the crucible 1 and the cooling means 4, as illustrated in FIG. 2. The graphite felt 9 is compressed during solidification of the silicon. The thickness of the graphite felt 9 thereby decreases and its thermal conductivity increases. Heat transfer by conductivity of the graphite felt 9 can then be controlled during the solidification process. The graphite felt 9 can also be progressively removed to control the cooling. The temperature gradient in the crucible 1 is typically controlled and kept at a value comprised between 8° C./cm and 30° C./cm.

Water cooling systems also exist. However it is difficult to control the temperature over a wide temperature range unless the latent heat from water vaporization is used, which is complicated to implement.

Document U.S. Pat. No. 6,299,682 describes an apparatus for producing a silicon ingot for photovoltaic applications. The apparatus comprises a heating system arranged above a crucible and cooling means arranged below the crucible. A heat source is also arranged under the crucible to control the heat removed at the bottom of crucible.

OBJECT OF THE INVENTION

The object of the invention is to remedy these drawbacks and in particular to achieve an efficient temperature adjustment while at the same time reducing the implementation costs of the device.

According to the invention, this object is achieved by the appended claims and more particularly by the fact that the cooling means are provided by an induction coil cooled by a cooling liquid flowing in the induction coil and by an electrically conductive induction susceptor positioned between the crucible and the induction coil.

It is a further object of the invention to provide a process for fabricating a block of crystalline material by directional crystallization using an equipment according to the invention, the process comprising:
  heating the crucible via the top and cooling the crucible via the bottom to establish the temperature gradient in the crystallization crucible, and
  controlling the heat extraction from the crucible via the bottom by means of the heat exchanger and by means of regulating of the adjustable additional heat source,
the cooling means being provided by an induction coil cooled by a cooling liquid circulating in the induction coil and by an electrically conducting induction susceptor arranged between the crucible and the induction coil,
  the process simultaneously comprising heating by means of the induction coil and cooling by means of the cooling liquid flowing in the induction coil, and
  the process comprising progressive reduction of the heating by means of reduction of the electric power supply of the induction coil, while a solidification front progresses in the crucible moving away from the susceptor.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

Figure 1:
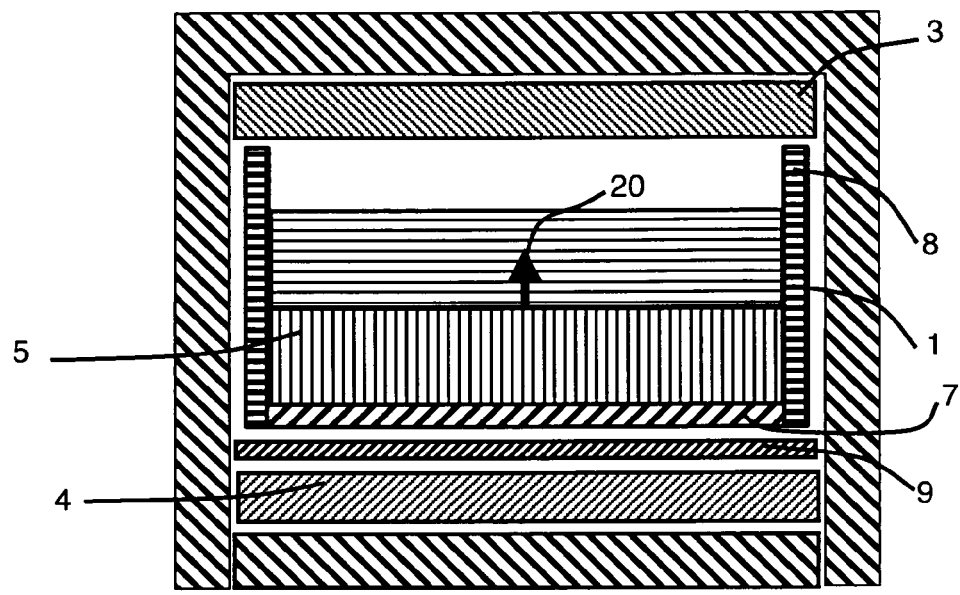
FIG. 1 shows an equipment for the fabrication of a block of crystalline material by directional crystallization according to the prior art.
Figure 2:
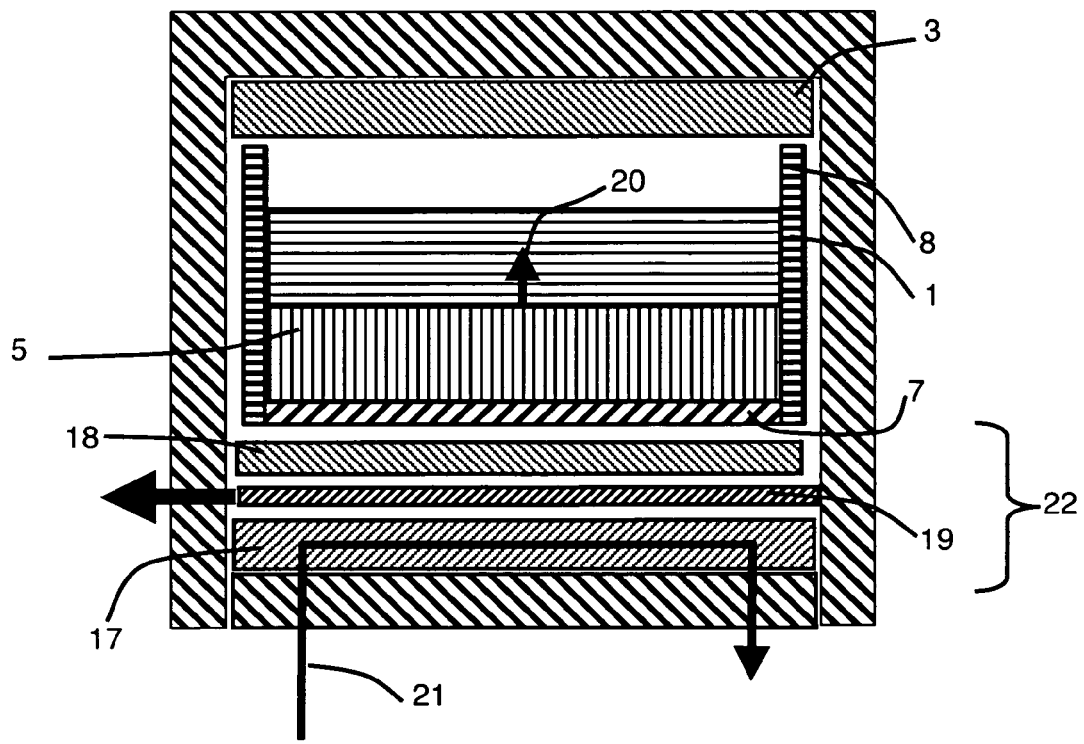
FIGS. 2 and 3 show two particular embodiments of the equipment according to the invention, in cross-section.

The fabrication equipment represented in FIG. 2 comprises a heat source 3 and a cooling system 22 arranged such as to establish a temperature gradient in the crystallization crucible 1. The cooling system 22 comprises a heat exchanger 17 and an adjustable additional heat source 18, for example resistive heating elements, infrared heating or any other suitable adjustable heating. The heat exchanger 17 preferably comprises a water cooling circuit represented schematically by arrow 21. The heat exchanger 17 can in particular be extended over the whole width of crucible 1.

The heat extraction from the crucible can thus be controlled, while at the same time benefiting from the advantages of a constant power heat exchanger, in particular its simple implementation.

The equipment can also comprise a removable felt 19 positioned above the heat exchanger 17 and under the adjustable additional heat source 18, thereby forming a screen preventing thermal radiation between the heat source 18 and the heat exchanger 17, thus enabling the heat extraction from the crucible 1 to be further controlled. By placing the removable felt 19 between the heat source 18 and the heat exchanger 17, the heat extraction is reduced, whereas removing the felt 19 allows for direct evacuation of the radiation emitted by the source 18 in the direction of the heat exchanger 17.

Figure 3:
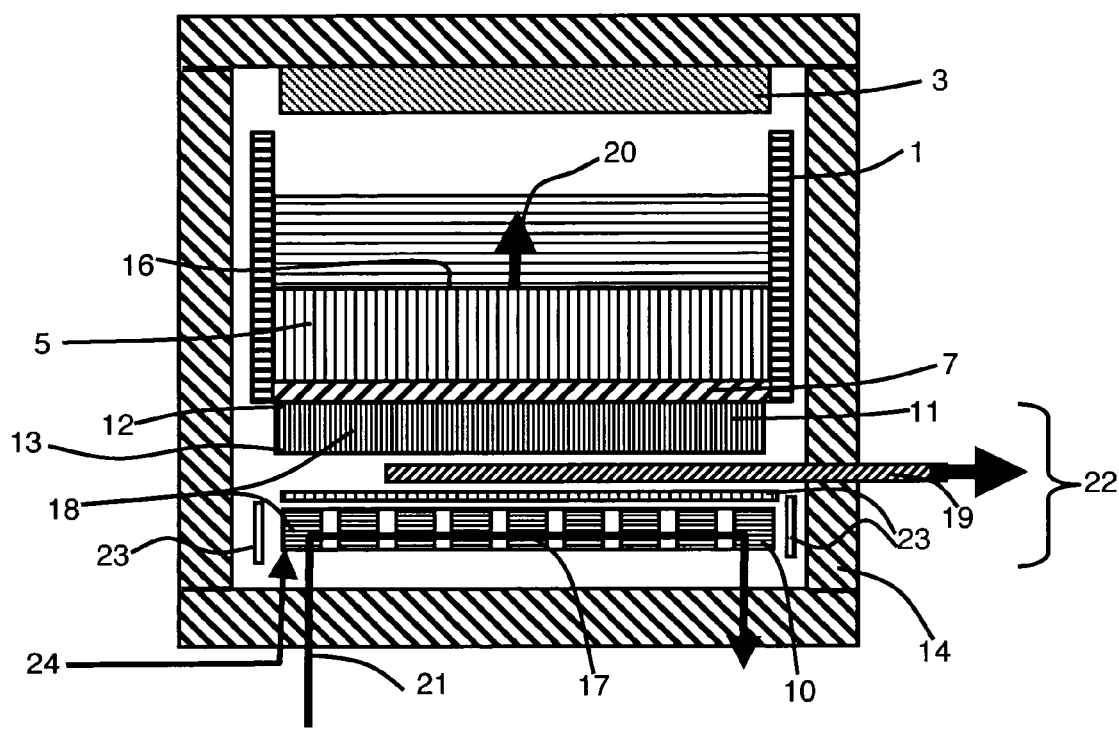

In the preferred embodiment represented in FIG. 3, the cooling system 22 comprises an induction coil 10 cooled by a coolant liquid circulating in the induction coil 10 and an electrically and thermally conducting induction susceptor 11 positioned between the crucible 1 and the induction coil 10.

The combination of the induction coil 10 and induction susceptor 11 thus provides an adjustable additional heat source 18. Adjustment is performed by means of the electric power supply 24 (see FIG. 3) for the induction coil 10. At the same time, the heat exchanger 17 is formed by the unit comprising the induction coil 10 and its cooling circuit consisting of a cooling liquid flowing in the induction coil 10, illustrated by arrow 21 in FIG. 3.

A heat source 3, for example formed by resistive heating elements, by an additional induction coil and its additional susceptor or by any other suitable heating means such as infrared heating for example, is positioned above the crucible 1. The induction coil 10 is arranged under the crucible. The induction susceptor 11 is situated between the crucible 1 and the induction coil 10. The crucible 1 preferably comprises a transparent bottom 7 made from impurity-free amorphous silica enabling infrared radiation to be transmitted. When a removable felt 19 is used as described above, the removable felt 19 can be positioned between the induction coil 10 and susceptor 11.

Induction coils according to the prior art are typically cooled by a cooling liquid circulating in the induction coil. Heating induction coils are however conventionally not in thermal contact with the object to be heated, and may even be thermally insulated from this object. Cooling therefore only acts on the coil itself and cannot act on the object to be heated.

The susceptor 11 is preferably made from thermally conducting material which absorbs infrared radiation, for example graphite or silicon carbide which are conductors and good black bodies. The heat emitted by the bottom 7 of the crucible 1 is thus absorbed by the face 12 of the susceptor arranged facing the crucible 1, transported through the susceptor 11 and re-emitted via the face 13 of the susceptor 11 arranged facing the induction coil 10. The induction coil 10 enables the heat to be evacuated. The susceptor 11 can form a support for the crucible 1 and enables a good thermal exchange to be obtained between the susceptor 11 and crucible 1. The induction coil 10 is preferably placed in an electrically insulated zone, using for example silica plates 23 to prevent short-circuits and formation of sparks to the neighboring graphite 14. As represented in FIG. 3, silica plates 23 are arranged around the induction coil 10.

The susceptor 11 can simply be formed by a flat plate. In a particular embodiment, the susceptor 11 comprises zones 15 of lower electric surface conductivity enabling induction heating to be locally reduced and also locally provoking heat extraction from the crucible 1 to the induction coil 10. The zones of crucible 1 situated opposite to zones 15 of lower electric surface conductivity are consequently less heated and thereby form nucleation centres for crystallization. In addition, the zones of crucible 1 opposite to zones 15 of lower electric surface conductivity are better cooled, since these zones 15 of lower electric surface conductivity also locally provoke heat removal from the crucible 1 towards the induction coil 10.

Figure 4:
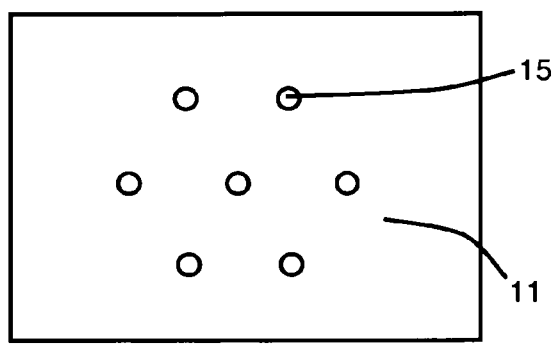
FIG. 4 illustrates a particular embodiment of a susceptor of a device according to the invention, in top view.

Zones 15 of lower electric surface conductivity are for example formed by holes arranged in the susceptor 11, as represented in FIG. 4. Zones 15 of lower electric surface conductivity can also be formed by a material having a lower electric conductivity than the material of susceptor 11 or by a zone having a smaller thickness than the susceptor. The lateral dimension of zones 15 of lower electric surface conductivity is preferably equal to or greater than the thickness of the susceptor. The distance between zones 15 of lower electric surface conductivity is for example 10 cm for a susceptor of a few tens of decimeters in size.

A process for the fabrication of a block of crystalline material by directional crystallization using an equipment according to the invention comprises heating of the crucible 1 via the top and cooling of the crucible 1 via the bottom to establish the temperature gradient in the crystallization crucible 1. The process further comprises heat extraction from the crucible 1 downwards by means of the heat exchanger 17 and by means of a regulated additional and adjustable heat source 18. The heat exchanger 17 can in particular operate in constant regime, which simplifies the implementation of the heat exchanger 17.

The process for the fabrication of a block of crystalline material by directional crystallization using the equipment according to the invention can in particular comprise heating by means of the induction coil 10 and its susceptor on the one hand, and at the same time cooling by means of the cooling liquid flowing inside the induction coil 10 on the other hand. While a solidification front 16 progresses in the crucible 1 moving away from the susceptor 11 in the upward direction as represented in FIG. 3 by arrow 20, heating is progressively reduced by reducing the electric power supply to the induction coil 10, whereas the cooling liquid can circulate flow in constant manner inside induction coil 10.

Before crystallization, the process can also comprise a melting step of the material to be crystallized using heat source 3 and adjustable additional heat source 18 comprising for example induction coil 10 and its susceptor 11. This in particular enables the material to be crystallized to be completely melted.

The invention is not limited to the embodiments represented. In particular, the gradient is not necessarily established from top to bottom and may be oriented along any axis, for example horizontal or inclined. In the latter case, the heating and cooling means are respectively arranged on each side of the gradient zone.

The invention claimed is:

1. A device for the fabrication of a block of crystalline material by directional crystallization, the device comprising:
    heating means and cooling means arranged such as to establish a temperature gradient in a crystallization crucible, the cooling means comprising a heat exchanger and an adjustable additional heat source, wherein
    the cooling means comprise an induction coil cooled by a cooling liquid circulating in the induction coil and an electrically conducting induction susceptor positioned between the crystallization crucible and the induction coil, and the susceptor comprises zones of lower surface electric conductivity enabling induction heating to be locally reduced and also locally provoking heat removal from the crystallization crucible to the induction coil.

2. The device according to claim 1, wherein the susceptor is made from a thermally conducting material that absorbs infrared radiation.

3. The device according to claim 2, wherein the susceptor is made from one of graphite and silicon carbide.

4. The device according to claim 1, wherein the susceptor forms a support for the crystallization crucible.

5. The device according to claim 1, wherein the zones of lower electric surface conductivity are formed
   by holes,
   by a material having a lower electric conductivity than a material of the susceptor
   or by a zone having a smaller thickness than the susceptor.

6. The device according to claim 1, further comprising silica plates arranged around the induction coil.

7. The device according to claim 1, wherein the crystallization crucible comprises a transparent bottom made from impurity-free amorphous silica.

8. The device according to claim 1, further comprising a removable felt positioned above the heat exchanger.

9. A process for the fabrication of a block of crystalline material by directional crystallization using the device according to claim 1, the process comprising:

heating the crystallization crucible via a top of the crystallization crucible and cooling the crystallization crucible via a bottom of the crystallization crucible to establish the temperature gradient in the crystallization crucible, and controlling the heat removal from the crystallization crucible via the bottom by means of the heat exchanger and by means of regulation of the adjustable additional heat source, the cooling means being formed by the induction coil cooled by a cooling liquid circulating in the induction coil and by the electrically conducting induction susceptor arranged between the crystallization crucible and the induction coil, the process simultaneously comprising heating by means of the induction coil and cooling by means of the cooling liquid circulating in the induction coil, and the process comprising progressive reduction of the heating by means of reduction of electric power supply of the induction coil, while a solidification front progresses in the crystallization crucible moving away from the susceptor.

10. The process according to claim 9, wherein, before crystallization, the process comprises a melting step of material to be crystallized, using the heating means and the adjustable additional heat source.

* * * * *